US010986698B2

(12) United States Patent
Schroder et al.

(10) Patent No.: US 10,986,698 B2
(45) Date of Patent: Apr. 20, 2021

(54) APPARATUS FOR PROVIDING TRANSIENT THERMAL PROFILE PROCESSING ON A MOVING SUBSTRATE

(71) Applicant: NCC NANO, LLC, Dallas, TX (US)

(72) Inventors: Kurt A. Schroder, Coupland, TX (US); Steven C. McCool, Austin, TX (US); Douglas K. Jackson, Austin, TX (US)

(73) Assignee: NCC NANO, LLC, Dallas, TX (US)

( * ) Notice: Subject to any disclaimer, the term of this patent is extended or adjusted under 35 U.S.C. 154(b) by 1233 days.

(21) Appl. No.: 14/540,639

(22) Filed: Nov. 13, 2014

(65) Prior Publication Data
US 2015/0055943 A1 Feb. 26, 2015

Related U.S. Application Data

(63) Continuation of application No. 13/082,469, filed on Apr. 8, 2011, now Pat. No. 8,907,258.
(Continued)

(51) Int. Cl.
*H05B 3/00* (2006.01)
*B29C 35/10* (2006.01)
(Continued)

(52) U.S. Cl.
CPC ......... *H05B 3/009* (2013.01); *B29C 35/0805* (2013.01); *B29C 35/10* (2013.01); *B29C 71/02* (2013.01); *F26B 3/28* (2013.01); *F26B 13/10* (2013.01); *H05B 1/0294* (2013.01); *H05K 3/1283* (2013.01); *B29C 2071/022* (2013.01); *H05B 41/34* (2013.01); *H05K 1/0386* (2013.01); *H05K 3/125* (2013.01); *H05K 2203/1545* (2013.01)

(58) Field of Classification Search
CPC .............................. H05B 3/009; H05B 1/0294
USPC .......... 219/300, 390, 497, 653; 34/265, 275, 34/448; 430/31, 39, 322
See application file for complete search history.

(56) References Cited

U.S. PATENT DOCUMENTS 5,221,561 A * 6/1993 Flicstein et al. .............. 427/534
2003/0183612 A1* 10/2003 Timans et al. ................ 219/390
(Continued)

FOREIGN PATENT DOCUMENTS

CN 201229800 Y * 4/2009 ............. H01B 11/00
WO WO 2006071419 A2 * 7/2006 ............... C25C 1/20

*Primary Examiner* — Thien S Tran
(74) *Attorney, Agent, or Firm* — Anthony P. Ng; Russell Ng PLLC

(57) ABSTRACT

A method and apparatus for thermally processing material on a low-temperature substrate using pulsed light from a flash lamp is disclosed. Material is conveyed past the flash lamp. The pulses of light are formed by Pulse Width Modulation to tailor the shape of the pulses to generate a thermal gradient in the substrate that enables the material to be heated beyond the maximum working temperature of the substrate without damage. Its shaped pulse rate is synchronized to the conveyance speed of a conveyance system. By using the information from a feedback sensor, the thermal gradient is recalculated to alter the shape of the pulses in real time for optimizing subsequent curings in real time without powering down the curing apparatus. The combined pulse shaping and synchronization allow a temperature profile to be tailored in the sample that is uniformly cured in the conveyance direction.

16 Claims, 5 Drawing Sheets

Related U.S. Application Data

(60) Provisional application No. 61/321,910, filed on Apr. 8, 2010.

(51) Int. Cl.
*H05K 3/12* (2006.01)
*F26B 13/10* (2006.01)
*F26B 3/28* (2006.01)
*B29C 71/02* (2006.01)
*B29C 35/08* (2006.01)
*H05B 1/02* (2006.01)
*H05B 41/34* (2006.01)
*H05K 1/03* (2006.01)

(56) References Cited

U.S. PATENT DOCUMENTS

| | | | |
|---|---|---|---|
| 2006/0021975 A1* | 2/2006 | Ott et al. | 219/121.8 |
| 2006/0174508 A1* | 8/2006 | Govek et al. | 34/265 |
| 2008/0020304 A1* | 1/2008 | Schroder et al. | 430/39 |
| 2009/0067823 A1* | 3/2009 | Kusuda | 392/418 |
| 2009/0181184 A1* | 7/2009 | Pope et al. | 427/554 |

* cited by examiner

APPARATUS FOR PROVIDING TRANSIENT THERMAL PROFILE PROCESSING ON A MOVING SUBSTRATE

PRIORITY CLAIM

The present application is a continuation of U.S. patent application Ser. No. 13/082,469, filed on Apr. 8, 2011, the contents of which are incorporated herein by reference.

BACKGROUND OF THE INVENTION

1. Technical Field

The present invention relates to an apparatus for curing thin films on substrates in general, and, in particular, to an apparatus for providing transient thermal profile processing for thin films on a moving substrate.

2. Description of Related Art

Thermal processing of thin films is often limited by the properties of substrates. Since the cost of substrates can be a significant portion of the total cost of the final product, inexpensive substrates are generally preferred. Inexpensive substrates, such as polymer or cellulose, tend to have a lower maximum working temperature than the more expensive substrates such as glass or ceramic. Thus, when thermally processing a thin film on a low-temperature substrate, the entire substrate stack is typically heated to the maximum working temperature of the substrate to minimize processing time.

Some thin film materials require a higher level of thermal processing that is not compatible with low-temperature substrates. Solutions can come in the form of increased processing time or increased temperature. The former solution increases the cost by reducing throughput and still may be inadequate for many types of thin films. The latter solution generally requires the usage of more expensive substrates that are capable of withstanding higher processing temperatures. Thus, both solutions are undesirable from an economic standpoint.

SUMMARY OF THE INVENTION

When it is not practical to use low-temperature substrates because certain properties may be required for a particular application, it is still desirable to process the material quickly. For example, it is necessary to control the transient thermal profile during high-speed processing to avoid damaging the materials due to thermal stresses. Consequently, it would be desirable to provide an apparatus for thermally processing thin film stacks at a relatively high speed without damaging them.

In accordance with a preferred embodiment of the present invention, a thermal processing apparatus includes a computer control system, a conveyance system, a flashlamp controller, and a flashlamp. The computer control system includes a simulation program to allow a user to custom design a specific thermal profile for curing a particular thin film stack. The flashlamp controller, which includes a power supply and flashlamp driver, modulates widths of pulses to achieve the specific thermal profile of a thin film stack. The flashlamp controller sends pulse-width modulated light to cure a thin film while the thin film is being moved by the conveyance system in relation to the flashlamp. Inputs from one or more sensors are received by the computer control system and are processed by a thermal simulator to send the desired thermal processing profile to the control computer system.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
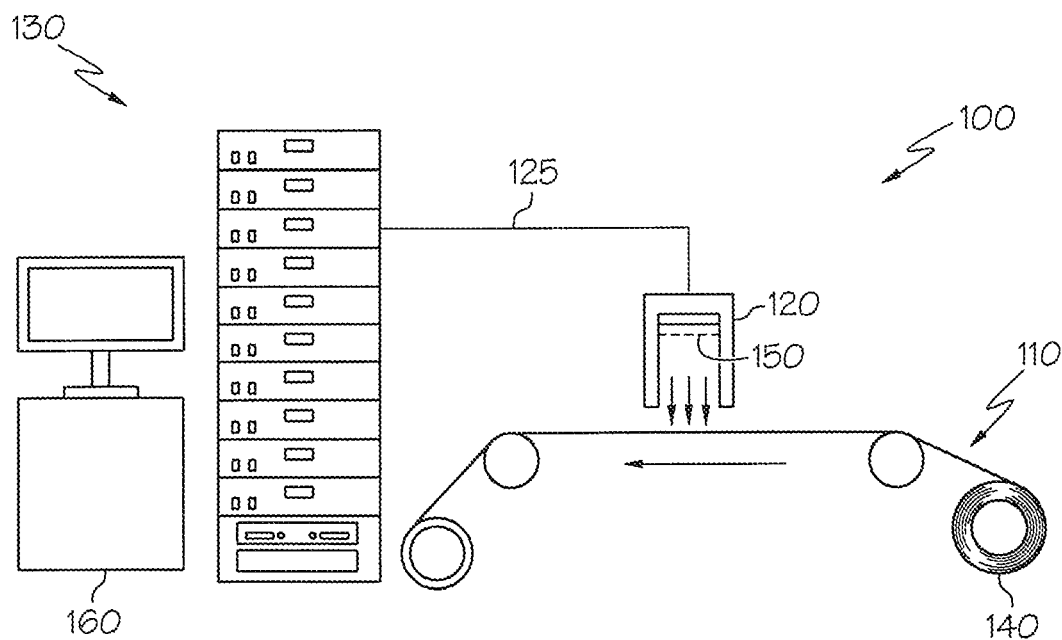
FIG. 1 is a diagram of a thermal processing apparatus, in accordance with a preferred embodiment of the present invention.

When transiently processing a thin film on a low-temperature substrate with pulsed light, it is desirable to control the thermal profile into the substrate. When heated transiently, it is possible to heat a thin film on a low-temperature substrate to a temperature far beyond the maximum working temperature of the low-temperature substrate without damage if the low-temperature substrate is heated quickly and cooled quickly. This allows one to choose a substrate with a much lower maximum working temperature over a high-temperature substrate that is almost always more expensive. Polyethylene terephthalate (PET), for example, has a maximum working temperature of 150° C. A thin film can be heated to beyond 1,000° C. on the surface of PET if the heating time is very short and the cooling rate is very fast. Both the heating time and cooling rate are determined by the shape of a curing light pulse as well as the physical properties and dimensions of thin films and substrates. An optimization of thermal processing generally involves the controlling of a thermal profile.

In the field of industrial thermal processing, "controlling a thermal profile" generally means controlling the temperature of a material in time. A simple thermal profile begins with a ramp-up phase in which temperature is increased at a certain rate for a specified amount of time, followed by a "soak" or constant temperature phase, and ends with a ramp-down phase in which the temperature is reduced at a certain rate for a specified amount of time. The purpose of ramping up and down the thermal profile is to avoid thermal gradients in the material being processed.

Materials can be processed in batches or in a continuous manner. In batch processing, materials are placed in an oven in which the temperature of the materials is changed over time to achieve a temperature versus time profile for the materials. In continuous processing, various zones are maintained at different temperatures and materials are conveyed through the various zones in order to achieve a temperature versus time profile for the materials. In both batch and continuous processing, materials to be treated are generally in thermal equilibrium. These general approaches apply to thermal heating as well as microwave, radio frequency, induction heating, radiant heating, etc.

For the present invention, "controlling a thermal profile" means controlling the temperature of a thin film stack (e.g., a thin film on a substrate) in time and in space. The thermal process described herein is fundamentally a batch process, but in practice it is continuous as it is continually processing material that is being conveyed such as a moving web or sheets on a conveyor.

For the present invention, thermal processing or curing includes drying (driving off solvent), particle sintering, densification, chemical reaction initiation, chemical reaction modulation, phase transformation, grain growth, annealing, surface functionalization, heat treating, etc. When thermally processing material on a thermally fragile substrate, such as paper, plastic, or polymer, a better cure can be attained when the curing is intense and transient rather than continuous equilibrium processes since the temperature that can be attained in the material without damaging the substrate is much greater. In contrast to conventional thermal processing, the present invention intentionally avoids a thermal equilibrium during processing.

Referring now to the drawings and in particular to FIG. 1, there is depicted a diagram of a curing apparatus, in accordance with a preferred embodiment of the present invention. As shown, a curing apparatus 100 includes a conveyance system 110, a flashlamp head 120 having a flashlamp 150 and a flashlamp controller 130. A low inductance cable 125 is connected between flashlamp controller 130 and the flashlamp head 120. Conveyance system 110 moves a thin film stack 140 past flashlamp head 120 while flashlamp controller 130 provides shaped pulses of current to flashlamp 150 using pulse width modulation (PWM) such that the shaped pulses are synchronized to the conveyance speed of thin films on conveyance system 110. Thin film stack 140 includes thin film deposited on a low-temperature substrate such as polymer or paper. Preferably, flashlamp 150 is a sealed flash lamp filled with gases such as xenon, krypton or argon. Flashlamp 150 can also be a water-wall flashlamp, sometimes referred to as a Directed Plasma Arc (DPA) lamp.

Flashlamp controller 130 includes a control computer 160. Control computer 160 preferably includes a processing unit, input devices such as a keyboard, a mouse, a touchscreen, etc., and output devices such as a monitor, as they are well-known to those skilled in the art. For the present embodiment, control computer 160 is a dual core machine running at 3 GHz and has 2 GB of system memory.

In order to pulse-width modulate a pulse train of a given duration, each individual pulse need to be relatively short in order to provide pulse shaping. Furthermore, the pulses need to be more intense than a source providing a single pulse since it is not turned on for a portion of the time. Thus, curing apparatus 100 needs to be capable of providing pulse lengths as short as 10 microseconds with peak power in excess of 100 kW/cm$^2$. In addition, the PWM frequency for pulses can be as fast as 50 kHz.

Each pulse includes at least two micropulses that form a shaped pulse. This allows the temperature profile in thin film stack 140 to be customized for an optimal cure. In its simplest form, a shaped pulse, which includes uniform micropulses, has six variables or control parameters: i. intensity (voltage), ii. pulse length, iii. average number of pulses that impinge on substrates in any given area on a thin film stack, iv. pulse repetition frequency, v. number of micropulses, and vi. duty cycle of micropulses. When the micropulses are not uniform, the duration and delay of each micropulse is also specified resulting in 8 control parameters. The 8 variables of the power delivery system to the flashlamp can be changed continuously and on-the-fly. This allows the curing parameters to adapt in real time to a change in the film or substrate in response from sensor data before or after cure. These two qualities produce a cured film with optimized and consistent results and has dramatically higher yield than the prior art which requires the system to be powered down for minutes to change any pulse characteristics. Furthermore, the pulse characteristics can be changed continuously to within about 0.1% resolution, which results in a much tighter optimization control of the curing. The prior art had discrete changes. The control parameters are initially entered into a thermal simulation described below, and these parameters are subsequently used as input to flashlamp controller 130.

The shape of light pulses from flashlamp 150 as well as the physical properties and dimensions of a thin film and substrate can affect the thermal gradient and the subsequent temperature at which the thin film can be processed without damaging the substrate. Thus, curing apparatus 100 also includes multiple sensors (not shown) for collecting various information from different parts of curing apparatus 100. The collected information from sensors and user inputs are fed back into computer control system 160 in which thermal profiles can be re-calculated. Using the re-calculated thermal profiles, flashlamp controller 130 controls the waveforms of the light being delivered to a thin film stack by flashlamp 150 as the thin film stack is being conveyed under flashlamp 150.

Sensors can be employed to measure either direct or indirect indicators of processed product performance. For example, Hall effect sensors could be used to monitor the conductivity of cured metallic traces and adjust process parameters to keep the conductivity within the control band. Many other type of contact or non-contact sensors can be employed to either continuously or intermittently monitor product performance to allow real-time adjustment of the output waveform of flashlamp 150.

Figure 2:
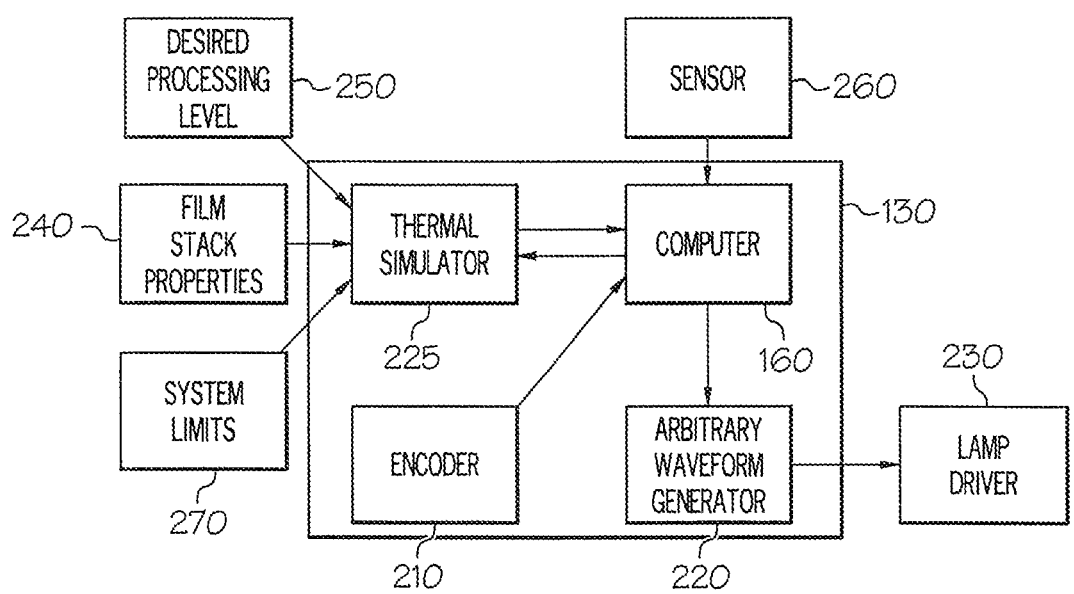
FIG. 2 is a block diagram of a flashlamp controller within the thermal processing apparatus from FIG. 1.

With reference now to FIG. 2, there is depicted a block diagram of flashlamp controller 130. As shown, flashlamp controller 130 includes an encoder 210, an arbitrary waveform generator 220, a thermal simulator 225, and control computer 160. User initially inputs thin film stack properties 240 and desired processing level 250 into flashlamp controller 130. After receiving inputs, such as conveyance speed, from conveyance system 110 (from FIG. 1) and additional system limits 270, encoder 210 provides trigger signals to computer which sends signals to arbitrary waveform generator 220 at appropriate times for curing thin films located on conveyance system 110. With the trigger signals, arbitrary waveform generator 220 is able to generate waveforms of various shapes and timing based on user inputs 240 and 250. Arbitrary waveform generator 220 sends waveform signals to flashlamp driver 230 that amplifies the waveform signals for driving flashlamp 150 (from FIG. 1).

In addition to being able to tailor the thermal profile in thin film stack 140, flashlamp controller 130 is able to change curing parameters continuously and on-the-fly based on the information received from multiple sensors by using PWM enabled by a very low inductance power delivery system. After receiving feedback information from multiple sensors 260 as well as system limit information 270, control computer 160 recalculates new curing conditions with information from thermal simulator 225 and sends the new curing conditions to arbitrary waveform generator 220 which sends waveform signals to flashlamp driver 230 that amplifies the waveform signals for driving flashlamp 150 (from FIG. 1).

The feedback information allows for continuous and real-time adjustability of parameters such as pulse energy, pulse duration, pulse waveform, etc, of curing apparatus 100. All of the above-mentioned parameters can be altered under software and/or hardware control on a millisecond timeframe with a resolution of 0.1%.

Both the rapid temporal and fine-grain control are important in thermal processing applications. The former allows adjustment of the process parameters within 0.2 inches (assuming 1 ms response) if a substrate is moving at 1,000 feet per minute (1,000 FPM=16.7 FPS=0.167 feet per millisecond or 2 inches per millisecond).

Before any curing operation, a user may enter various parameters of thin film stack 140, such as the number of layers as well as thickness, thermal conductivity, density, heat capacity, and optical absorption depth of each layer into a thermal stack simulation program installed within control computer 160. The pulse control parameters entered into the thermal simulation of thin film stack 140 are also used as input to flashlamp controller 130. Thin film stack 140 may have any number of layers of different materials of specified thicknesses, thermal coefficients, and absorption coefficients. Some printed electronics devices have as many as 10 layers, each of which must be processed within their thermal limits.

After a conveyance speed of thin film stack 140 has been entered, the time delay between each shaped pulse can be calculated by the simulation program within control computer 160. The thermal stack simulation program within control computer 160 then generates a simulated heat profile in time and in space of thin film stack 140.

The output of the simulation is a graph of the temperature versus time and location in thin film stack 140 during and after the heating event. Since the absorption coefficient of each layer of thin, film stack 140 is specified, the radiation absorption can be shared by one or more of the layers including the center of thin film stack 140 giving rise to complex thermal distributions within thin film stack 140.

The power input versus time parameters from the simulation results can be used as inputs to flashlamp controller 130. The power supply module of flashlamp driver 230 within flashlamp controller 130 then charges the capacitors in flashlamp driver 230 to a particular voltage. In some applications, this must occur within a millisecond to insure consistent processing. Flashlamp driver 230 switches the capacitor bank within each module to send current through a low-impedance cable to flashlamp head 120 to irradiate thin film stack 140. The pulse train is synchronized to the conveyance speed of thin film stack 140 on conveyance system 110.

Figure 3:
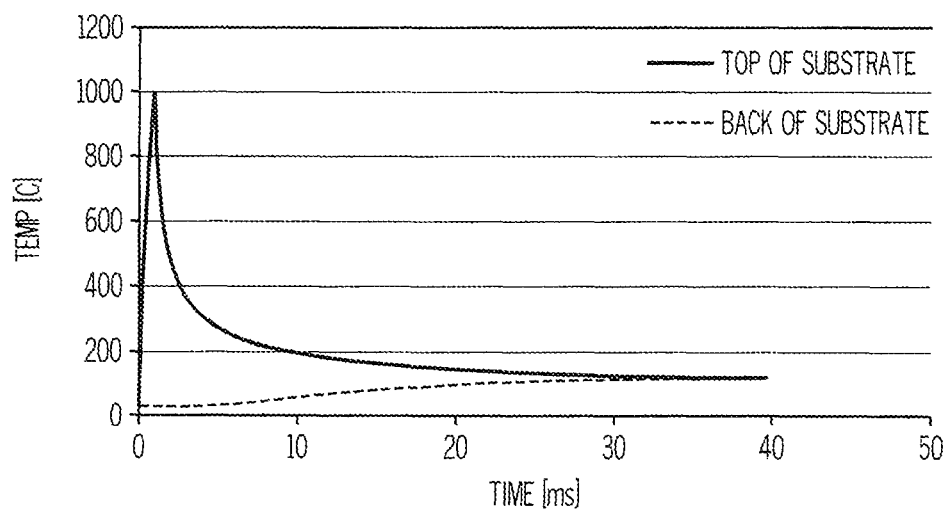
FIGS. 3-9 are waveforms of various simulated thermal profiles.

FIG. 3 shows a thermal profile when a 1 ms long pulse of constant power (total radiant exposure: 1.49 J/cm$^2$) is absorbed by a 0.5 micron thick absorber on a sheet of PET 150 microns thick. The peak temperature reached at the surface of the absorber (and at the surface of the PET since the absorber is so thin) is about 1,000° C. After 1 ms, the heat at the surface diffuses into the bulk of the PET. After about 30 ms, the stack is near thermal equilibrium.

Figure 4:
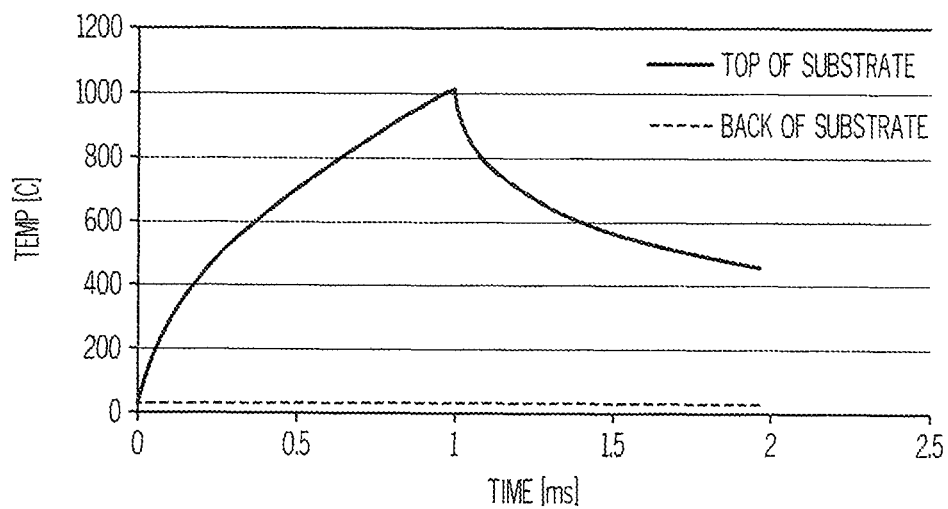

FIG. 4 shows a thermal profile with the same conditions as those in FIG. 3 but on a timescale comparable to the pulse duration. During heating, the temperature at the back of the PET is seen to be virtually unchanged.

Figure 5:
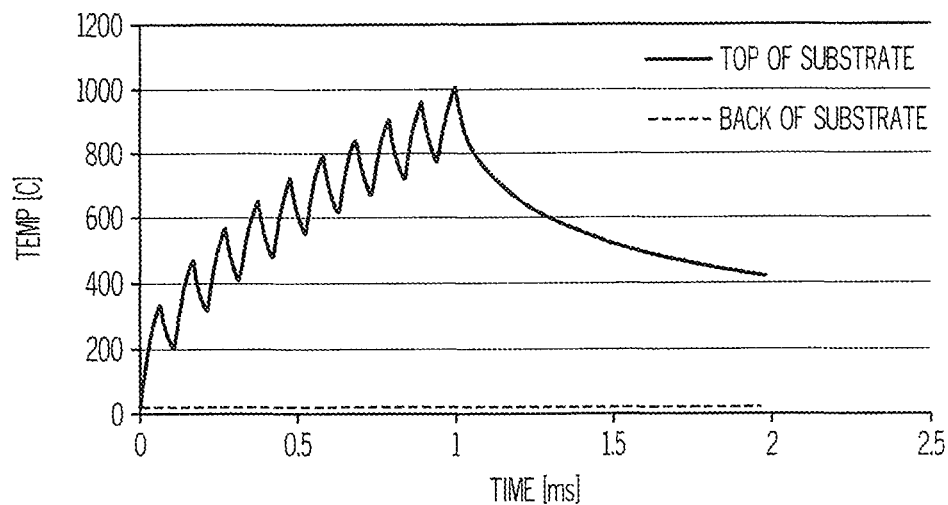

FIG. 5 shows a thermal profile having an envelope pulse length and peak temperature similar to FIG. 4, but is composed of 10 identically spaced micropulses. The micropulses cause less damage to a substrate than the single pulse of FIG. 4.

Figure 6:
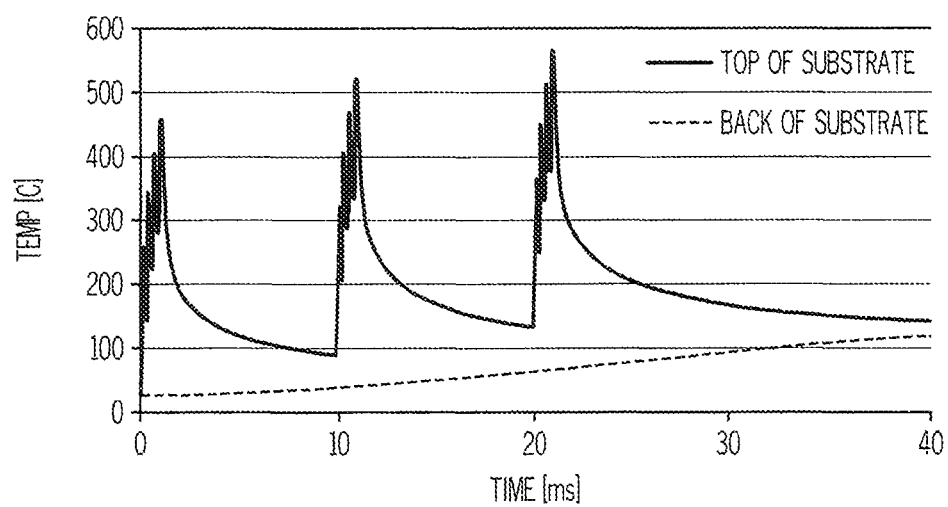

FIG. 6 shows a thermal profile similar to that of FIG. 5, but with lower intensity and repetitively pulsed three times at 100 Hz. This is the temperature profile in time when the substrate is not moving. When the substrate is moving, and the flashlamp pulse frequency is synchronized to the conveyance speed, the frequency is given by:

$$f = \frac{1.67 \times S \times O}{W}$$

where.
f=flashlamp shaped-pulse rate [Hz]
S=web speed [m/min]
O=overlap factor (i.e., the average number of flashlamp pulses received by substrate at any given point)
W curing head width in the conveyance direction [cm]

For example, with a conveyance speed of 100 m/min, and overlap factor of 4, and a curing head width of 7 cm, the pulse rate of the strobe is 95.4 Hz.

The thermal profile shown in FIG. 6 is nearly identical to the thermal profile of the moving substrate provided the width of the curing head is large compared to the distance the substrate moves during the pulse. At 100 m/min, the substrate moves only 1.6 mm during the pulse. Since the curing head width in the substrate conveyance direction is 7 cm or nearly 50 times larger, this is a reasonable approximation.

EXAMPLE 1

Rapid Drying of a Thin Film on 150 Micron Thick PET

A rapidly pulsed heating source with sufficient intensity can dry a thin film on a low temperature substrate in a non-destructive manner much faster than a continuous source. When the individual pulses of FIG. 4 are broken up into the multiple pulses of FIG. 5, the thin film is allowed to breathe during the rapid heating process, thereby preventing a cohesive failure of the film while still drying the film very rapidly. In the context of the present invention, "breathe" means to allow adequate time for non-destructive convective transport of evolved gasses. The shaped pulses can be synchronized to a moving web as in FIG. 6.

Note that this has a very different effect than a continuous train of rapid small pulses. In that case, the surface does not reach the peak temperatures achieved in the present invention. Consequently, it has a lower processing rate, and the bulk of the substrate is preferentially heated over the present invention.

EXAMPLE 2

Temperature Control at the Surface of a Polymer Substrate

Figure 7:
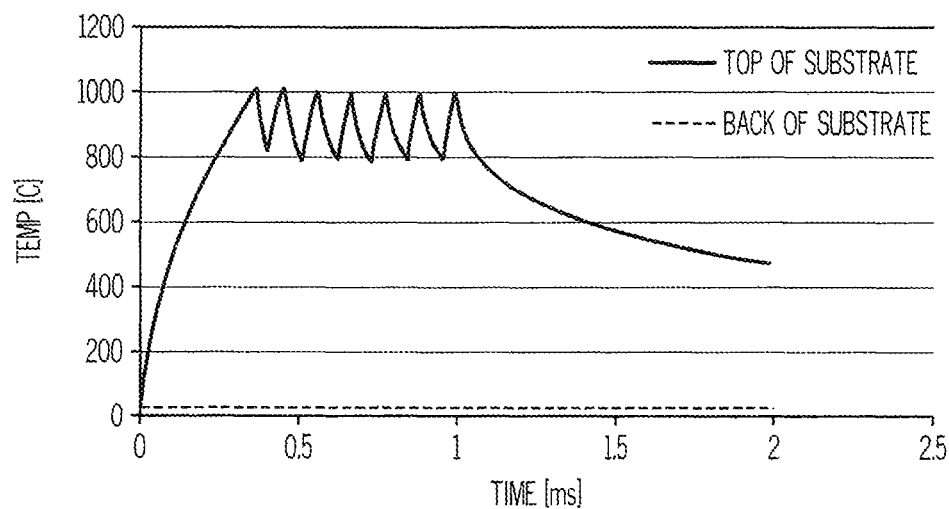

FIG. 7 shows a thermal profile of the same thermal stack as in FIG. 5. The peak temperature achieved and the envelope pulse length are identical in the two cases. However, in FIG. 7 the ramp-up rate is much faster, and the peak temperature is maintained for the duration of the pulse. When this is done, 1.2% more energy can be delivered to the thin film within the same I ins interval. When sintering a metal ink to form a conductor, this small improvement can translate into a doubling of the conductivity of the thin film. This is done by adjusting the duration and delay of each individual micropulse in the shaped pulse Since the surface of the thin film still only reaches 1,000° C., this curing profile results in a better cure of the thin film without damaging the fragile substrate.

Figure 8:
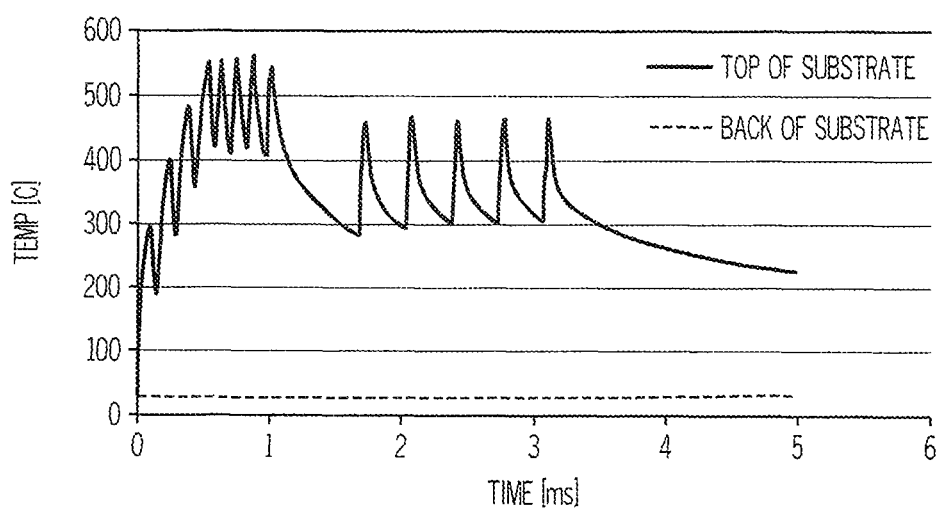

FIG. 8 shows a thermal profile of a more complex waveform in which a thin film is heated on the surface of a polyimide substrate. The waveform shows distinct ramp-up, soak, relaxation, and soak phases forming a complex thermal profile on a 1 ms timescale. Ordinarily, polyimide tolerate a temperature beyond 450° C., so the method of the present invention is capable of processing on a surface beyond the above-mentioned temperature.

EXAMPLE 3

Prevention of Cohesive Failure in a Thin Film by Modulation of Gas Generation

An aqueous copper precursor ink was formulated comprising 10.0% wt. copper (II) oxide, 4.5% wt. copper (II) acetate in a base containing ethylene glycol and glycerol. Traces were printed onto a 125 micron thick PET sheet using an Epson Stylus C88 ink jet printer. Upon curing with a flashlamp, the copper oxide and copper acetate are reduced by the ethylene glycol and glycerol to form a film of conductive copper metal. The reduction reaction generates a moderate amount of gas.

The printed film was cured using the present invention with the following conditions: voltage 250 V, pulse envelope duration 1,050 microseconds, 4 micropulses with a duty cycle of 0.6 (i.e., each micropulse was 175 microsecond long with a delay of 117 microseconds between pulses), overlap factor=3, web speed=6.4 meters/min. The sample yield was 100% with an average sheet resistance of 3.7 Ω/square.

When the identical trace was cured with the same equipment, but with only a single pulse, the gas evolution caused a cohesive failure of the traces resulting in a sample yield of only 64%. The average sheet resistance was 5.2 Ω/square. Changing any of the input variables resulted in a less conductive or poorer yield trace.

EXAMPLE 4

Temperature Profile Control Within a Glass Substrate

When a thin film is heated on glass too intensely by a flashlamp, the glass can crack near the interface. This is due to the intense thermal gradient in the glass causing a difference in expansion of the glass. When the stress in the glass exceeds the yield strength of the glass, it fails. By shaping the heat pulse, an intense cure of a thin film can be attained without exceeding the critical temperature gradient within the glass. This technique allows weaker (and cheaper) forms of glass to be substituted for stronger (and more expensive) ones.

Figure 9:
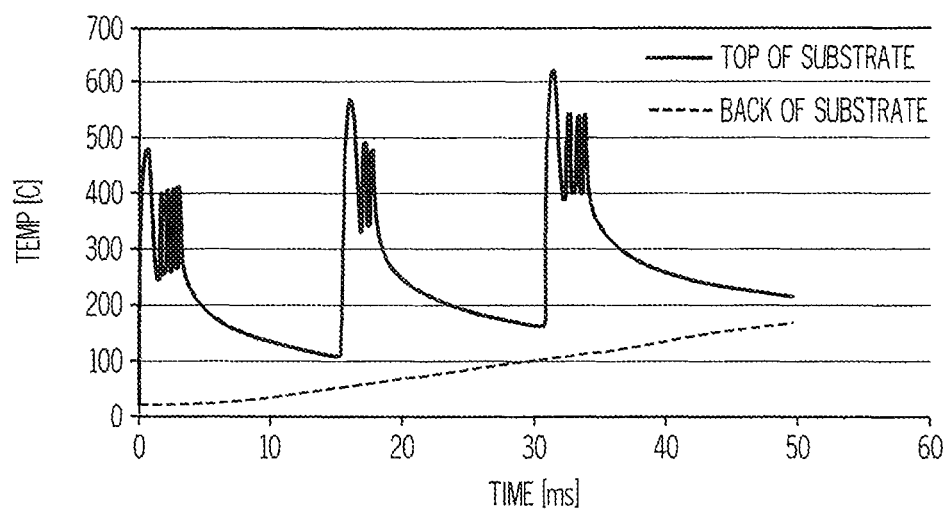

FIG. 9 shows the complex waveform of FIG. 8 in a repetitively pulsed mode on borosilicate glass in which the thermal gradient is controlled to prevent cracking.

The utility of the present invention is expanded greatly by the addition of real-time feedback systems. Such feedback is uniquely viable with the present invention because, unlike prior art, it allows for continuous and real-time adjustability of the pulse energy, pulse duration, and even the pulse waveform. All 8 of these parameters can be altered under software and/or hardware control on the millisecond timeframe with a resolution of typically 0.1%. In this system, one or more sensors are used to monitor either incoming or processed product or strobe output characteristics and combined with feedback hardware and software to adjust processing parameters to compensate for changes, optimize product characteristics, or even intentionally ramp or modulate product characteristics.

Both the rapid temporal and fine-grain control are important in commercial applications by bringing the process back within the control band without wasting any product even on a high-speed reel-to-reel system. This furthermore eliminates the need to slice out and discard bad product.

The high resolution continuous adjustability is important because the curing process has been demonstrated to be highly non-linear in many cases wherein a 2% variation in intensity can result in a 10% or greater variation in product performance; resistivity for example. This makes systems with coarse discrete parameter control essentially unusable for commercial processing requiring good quality control.

In some applications it is advantageous to adjust the spectral content of the pulses of flashlamp 150 by adjusting the frequency and voltage of a rapidly pulsed train while maintaining the same pulse train length. This has the effect of adjusting the uv content of the spectrum while still maintaining the average power and pulse duration of the shaped pulse. The spectrum emitted by the flashlamp system can furthermore be adjusted in real-time using high power absorbers such as adjustable liquid filters or controlled the reflection angle in wavelength adjusting optics.

There are four categories of sensors that can be employed to achieve feedback control of arbitrary waveform generator 220:

1. upstream sensors which detect either intentional or unintentional variation in the unprocessed product such as product spatial patterns, temperature, print thickness, or degree of drying;
2. downstream sensors which detect drift in the processed product performance such as trace conductivity or substrate damage;
3. flashlamp emission sensors which detect long-term variation in the light output of the lamp and short-term variation in the light output to correctly model the time-dependent heat input to the product; and
4. lamp driver status sensors which enable the control software to adapt to limits to the lamp drivers ability to produce the optimum drive waveform—for example, the charging rate of the power supply will limit the available pulse energy during high rate operation.

The following gives examples of how these types of sensors are utilized in practice. A basic feedback application automatically adjusts the system output intensity in response to a photodiode sensor to compensate for the inevitable gradual and continuous degradation of flashlamp output over millions of pulses. This improves product quality and extends the useful flashlamp lifetime. This same approach could be extended to compensate for any normal changes in the strobe system including fogging of windows.

A more sophisticated feedback system uses product soft X-ray transmission to monitor the coat-weight of applied ink or film and adjust pulse parameters to optimize for variation in the product to be processed. This same approach can be extended to compensate for most uncontrolled variations in product characteristics.

Sensors can be employed to measure either direct or indirect indicators of processed product performance. For example, Hall effect sensors may be used to monitor the conductivity of cured metallic traces and adjust the drive waveform parameters to keep the conductivity within the control band. Many other contact or non-contact sensors can be employed to either continuously or intermittently monitor product performance to allow realtime adjustment of the strobe output waveform.

Any of these feedback approaches can use multiple sensors in the direction transverse to the direction of product motion. This is useful in systems with multiple flashlamps or in which product characteristics vary laterally either before or after processing. Any of the feedback approaches can also use multiple sensors along the direction of product motion to obtain data on product drying rate or data for predictive analysis.

As has been described, the present invention provides a curing apparatus for providing transient thermal profile processing on a moving substrate. The curing apparatus of the present invention enables the real-time continuous variable control of the shape of pulsed light waveform based on feedbacks received from sensors and inputs from users. The shape of pulsed light waveforms can be changed on-the-fly with arbitrarily small changes, which allows thin film processing to be controlled in real time.

While the invention has been particularly shown and described with reference to a preferred embodiment, it will be understood by those skilled in the art that various changes in form and detail may be made therein without departing from the spirit and scope of the invention.

What is claimed is:

1. An apparatus for curing a thin film on a moving substrate, said apparatus comprising:
   a conveyance system for moving said thin film mounted on said substrate;
   a flashlamp controller for modifying pulse widths of multiplepulses to generate a specific waveform that controls temperatures of a first side and a second side of said substrate in a time scale according to a specific thermal profile such that said temperatures of said first and second sides of said substrate are different, wherein said flashlamp controller includes
   a waveform generator; and
   an encoder that sends control signals to said waveform generator to generate said specific waveform; and
   a flashlamp for providing an electromagnetic pulse according to shapes and timing of said specific waveform, wherein said electromagnetic pulse is utilized to cure said thin film while said thin film is being moved in relation to said flashlamp.

2. The apparatus of claim 1, wherein said flashlamp controller includes a plurality of sensors for measuring temperatures of said substrate to provide feedback for said waveform generator.

3. The apparatus of claim 1, wherein said substrate has a decomposition temperature of less than 450° C.

4. The apparatus of claim 1, wherein said substrate is made of plastic.

5. The apparatus of claim 1, wherein said substrate is made of paper.

6. The apparatus of claim 1, wherein said substrate is made of polymer.

7. The apparatus of claim 1, wherein an instantaneous power of said apparatus is greater than 5 MW.

8. The apparatus of claim 1, wherein the timings of said pulse-width modulated electromagnetic pulses are changed in response to an input from a sensor without powering down said apparatus.

9. The apparatus of claim 1, wherein said apparatus further includes a low inductance cable connecting between said flashlamp controller and said flashlamp.

10. The apparatus of claim 1, wherein said flashlamp delivers a pulse having a pulse length of 10 microseconds with a peak power in excess of 100 kW/cm$^2$.

11. The apparatus of claim 1, wherein said specific thermal profile is expressed in temperature as a function of time and depth of said thin film and substrate.

12. The apparatus of claim 1, wherein said flashlamp is a gas-filled flashlamp.

13. The apparatus of claim 12, wherein said gas is xenon.

14. The apparatus of claim 12, wherein said gas is argon.

15. The apparatus of claim 1, wherein said flashlamp is a water-wall flashlamp.

16. The apparatus of claim 1, wherein a pulse frequency of said flashlamp is synchronized to a conveyance speed of said conveyance system by:

$$f = \frac{1.67 \times S \times O}{W}$$

where
   f=a shaped-pulse rate of said flashlamp
   S=said conveyance speed
   O=an overlap factor
   W=a curing width of said flashlamp in a conveyance direction.

* * * * *